(12) United States Patent
Yasuda et al.

(10) Patent No.: US 8,077,476 B2
(45) Date of Patent: Dec. 13, 2011

(54) ELECTRONIC DEVICE MOUNTING STRUCTURE

(75) Inventors: Akio Yasuda, Kosai (JP); Kenichi Mori, Obu (JP)

(73) Assignee: Denso Corporation, Kariya (JP)

( * ) Notice: Subject to any disclaimer, the term of this patent is extended or adjusted under 35 U.S.C. 154(b) by 742 days.

(21) Appl. No.: 12/208,634

(22) Filed: Sep. 11, 2008

(65) Prior Publication Data

US 2009/0067131 A1 Mar. 12, 2009

(30) Foreign Application Priority Data

Sep. 12, 2007 (JP) ................................. 2007-237168

(51) Int. Cl.
*H05K 7/20* (2006.01)
(52) U.S. Cl. ........ 361/775; 361/704; 361/715; 361/719; 361/679.54; 165/80.3; 165/185; 174/16.3; 174/252; 257/678; 257/686; 257/706; 257/718
(58) Field of Classification Search ............ 361/679.46, 361/679.47, 679.54, 703–712, 719–724, 361/772–777, 790–795; 257/E21.514, E23.08, 257/E23.078, E23.026, E23.1, E25.01, E25.03, 257/E25.016, E25.51, 678, 686, 706–727, 257/785, 689, 690; 165/80.2, 80.3, 80.4, 165/185, 104.33; 174/16.3, 252; 29/602.1, 29/841, 854, 592.1, 832
See application file for complete search history.

(56) References Cited

U.S. PATENT DOCUMENTS

| | | | | |
|---|---|---|---|---|
| 3,916,435 | A * | 10/1975 | Camplin et al. | 257/785 |
| 4,313,128 | A * | 1/1982 | Schlegel et al. | 257/689 |
| 5,307,236 | A * | 4/1994 | Rio et al. | 361/720 |
| 6,034,874 | A * | 3/2000 | Watanabe | 361/704 |
| 6,043,981 | A * | 3/2000 | Markow et al. | 361/704 |
| 6,542,365 | B2 | 4/2003 | Inoue | |
| 6,545,352 | B1 * | 4/2003 | Ruckdeschel | 257/718 |
| 6,845,012 | B2 | 1/2005 | Ohkouchi | |
| 6,870,738 | B2 * | 3/2005 | Goebl | 361/719 |
| 7,027,302 | B2 | 4/2006 | Inoue | |
| 7,106,592 | B2 | 9/2006 | Inoue et al. | |
| 7,187,553 | B2 * | 3/2007 | Schmidberger | 361/719 |
| 7,248,478 | B2 | 7/2007 | Inoue | |
| 7,250,674 | B2 | 7/2007 | Inoue | |

(Continued)

FOREIGN PATENT DOCUMENTS

DE 003232154 A1 * 3/1984

(Continued)

OTHER PUBLICATIONS

Japanese Office Action dated Jul. 21, 2009, issued in corresponding Japanese Application No. 2007-237168, with English translation.

*Primary Examiner* — Michail V Datskovskiy
(74) *Attorney, Agent, or Firm* — Nixon & Vanderhye PC

(57) ABSTRACT

An electronic device mounting structure includes a thermally conductive base, a busbar located on the base, an electronic device mounted on the busbar, a thermally conductive wall standing on the base and having first and second portions located opposite each other across the electronic device, and a plate spring supported by the first and second portions of the wall. The plate spring presses the electronic device against the base so that thermal resistance between the electronic device and the base is reduced. The plate spring has a thermal conductivity so that heat in the electronic device is transferred to the wall through the plate spring.

12 Claims, 5 Drawing Sheets

U.S. PATENT DOCUMENTS

2002/0051348 A1    5/2002  Sunami et al.
2005/0230795 A1 * 10/2005  Furuyama et al. ............ 257/678

FOREIGN PATENT DOCUMENTS

| JP | 2-8090 | 1/1990 |
| JP | 4-43001 | 4/1992 |
| JP | U-H5-67082 | 9/1993 |
| JP | 06-342989 | 12/1994 |
| JP | 07-231053 | 8/1995 |
| JP | 07-321262 | 12/1995 |
| JP | 08-204370 | 8/1996 |
| JP | 08-274421 | 10/1996 |
| JP | 411186472 A * | 7/1999 |
| JP | 2001-135762 | 5/2001 |
| JP | 2001-358482 | 12/2001 |

* cited by examiner

ELECTRONIC DEVICE MOUNTING STRUCTURE

CROSS REFERENCE TO RELATED APPLICATION

This application is based on and incorporates herein by reference Japanese Patent Application No. 2007-237168 filed on Sep. 12, 2007.

FIELD OF THE INVENTION

The present invention relates to an electronic device mounting structure including an electronic device mounted to a busbar on a base plate.

BACKGROUND OF THE INVENTION

In some applications, an electronic device such as a semiconductor module generates a lot of heat and is used under high temperature conditions. As a result, a temperature of the electronic device becomes high. Therefore, cooling of the electronic device is important, for example, to prevent the electronic device from being thermally broken down.

U.S. Pat. No. 7,250,674 corresponding to JP-A-2002-83915 discloses an electronic device mounting structure, in which an electronic device placed on a heatsink is pressed against the heatsink by a metallic elastic member shaped like a shrine gate. Thus, a thermal resistance (i.e., heat transfer resistance) between the electronic device and the heatsink is reduced so that heat in the electronic device can be efficiently transferred to the heatsink. Further, the heat can be transferred to the heatsink by passing through the elastic member. Therefore, the heat in the electronic device can be efficiently dissipated through the heatsink.

However, making the elastic member requires a lot of time and effort, because the elastic member has a complex shape like a shrine gate. If the electronic devices have different shapes or sizes, various types of elastic members are needed. Therefore, it is not easy to put the structure disclosed in U.S. Pat. No. 7,250,674 to practical use.

SUMMARY OF THE INVENTION

In view of the above-described problem, it is an object of the present invention to provide an electronic device mounting structure having improved cooling performance and manufacturability.

According to an aspect of the present invention, an electronic device mounting structure includes a base having a thermal conductivity, a busbar located on a surface of the base and electrically insulated from the base, an electronic device located on the busbar and electrically coupled to the busbar, a thermal conductive wall member standing on a surface of the base and having first and second portions located opposite each other across the electronic device, and a plate spring supported by the first and second portions of the wall member and extending substantially parallel to the surface of the base. The plate spring presses the electronic device against the base though the busbar. The plate spring has a thermal conductivity to transfer heat from the electronic device to the wall member therethrough.

According to another aspect of the present invention, an electronic device mounting structure includes a base having a thermal conductivity, an electronic device located on the base, and an elastic biasing member supported by the base and configured to press the electronic device against the base, the elastic biasing member having a thermal conductivity to transfer heat from the electronic device to the base therethrough. The elastic biasing member is made of a ferromagnetic material and configured as an electromagnetic shielding for the electronic device.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
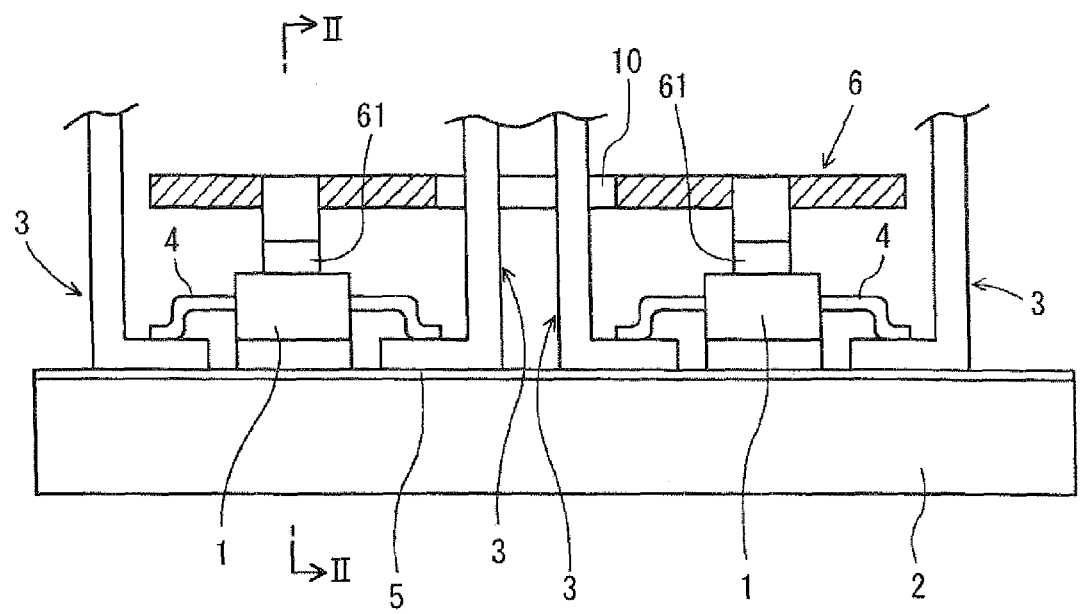
FIG. 1 is a diagram illustrating a cross-sectional view of an electronic device mounting structure according to a first embodiment of the present invention.

An electronic device mounting structure according to a first embodiment of the present invention is described below with reference to FIGS. 1-4. The mounting structure includes electronic devices 1, a base plate 2, busbars 3, an electrical insulation film 5 such as a resin film, and an elastic biasing member 6, a pair of wall members 7, and a column member 8.

Each electronic device 1 has a resin body and lead terminals 4 protruding from each side of the body. That is, the electronic device 1 is a resin-molded integrated circuit (IC) configured as a dual in-line package (DIP). Alternatively, the electronic device 1 can be a ceramic-packaged IC and configured as a single in-line package (SIP), or the like.

The wall members 7 are integrally formed with the base plate 2, for example, by aluminum die casting. Likewise, the column member 8 is integrally formed with the base plate 2, for example, by aluminum die casting. The busbars 3 and the lead terminal 4 are made of copper, for example.

The base plate 2 absorbs and dissipates heat and is usually referred as a heatsink. The base plate 2 can be made of a material having a thermal conductivity. For example, the base plate 2 can be made of aluminum, which has a good thermal conductivity. The base plate 2 can be a part of a casing for accommodating the electronic device mounting structure. The base plate 2 can be provided with a cooling fin, a coolant passage, and/or the like.

Figure 4:
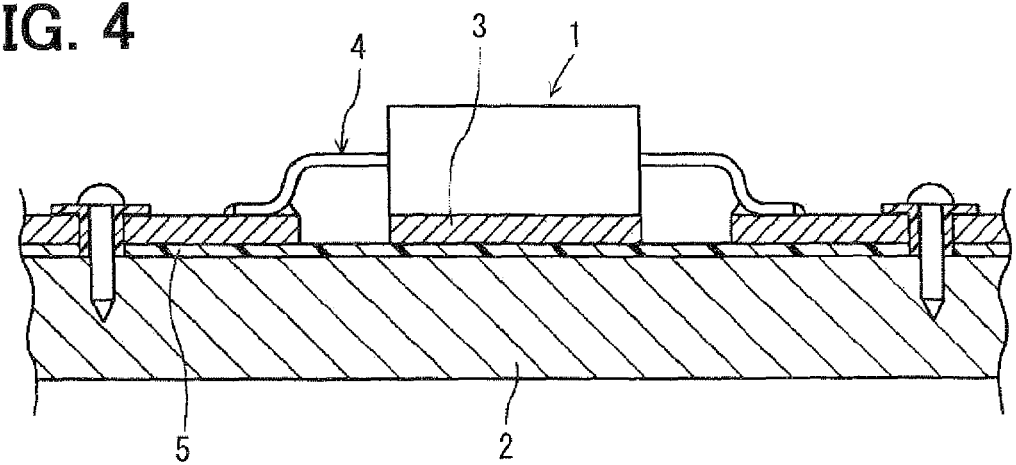
FIG. 4 is a diagram illustrating a partially enlarged view of FIG. 1.

The busbars 3 are placed on a top surface of the base plate 2 through the insulation film 5. The insulation film 5 provides electrical insulation between the base plate 2 and the busbars 3. Alternatively, the electrical insulation can be provided by an electrical insulation layer formed on the top surface of the base plate 2. For example, the insulation film 5 can be made of resin. As shown in FIG. 4, each busbar 3 is fixed to the base plate 2 by a screw. The screw is received in a resin sleeve so that the electrical insulation between the base plate 2 and the busbar 3 can be maintained. As described previously, the busbar 3 can be made of copper. It is preferable that the base plate 2 be made of a material having a coefficient of linear (thermal) expansion close to that of a material of which the busbar 3 is made. In such an approach, thermal stress due to a difference in coefficients of linear expansion between the base plate 2 and the busbar 3 can be reduced.

In the first embodiment, four electronic devices 1 are mounted on the busbars 3, and each electronic device 1 is soldered to a corresponding busbar 3. Specifically, as shown in FIG. 1, the busbar 3 has a first end located on each side of the body of the electronic device 1, and the lead terminals 4 of the electronic device 1 is soldered to the first end of the busbar 3. The busbar 3 is bent at the first end at a right angle so that a second end of the busbar 3 can extend upwardly with respect to the base plate 2. Although not shown in the drawings, the second end of the busbar 3 is inserted into a hole of a printed circuit board and soldered to a trace pattern around the hole. Thus, the electronic device 1 is electrically coupled to the printed circuit board through the busbar 3.

Figure 2:
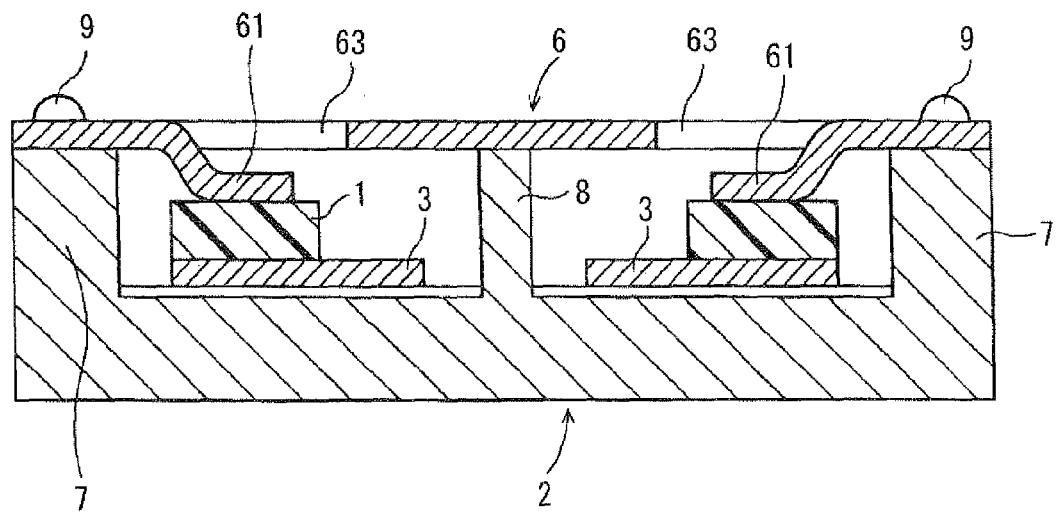
FIG. 2 is a diagram illustrating a cross-sectional view taken along line II-II of FIG. 1.

As shown in FIG. 2, the wall member 7 stands on the top surface of the base plate 2 on each edge of the base plate 2. The column member 8 stands on the top surface of the base plate 2 in the center of the base plate 2. The wall members 7 are located opposite each other across the electronic device 1. Specifically, the column member 8 and each of the wall members 7 are located opposite each other across the electronic device 1.

Figure 3:
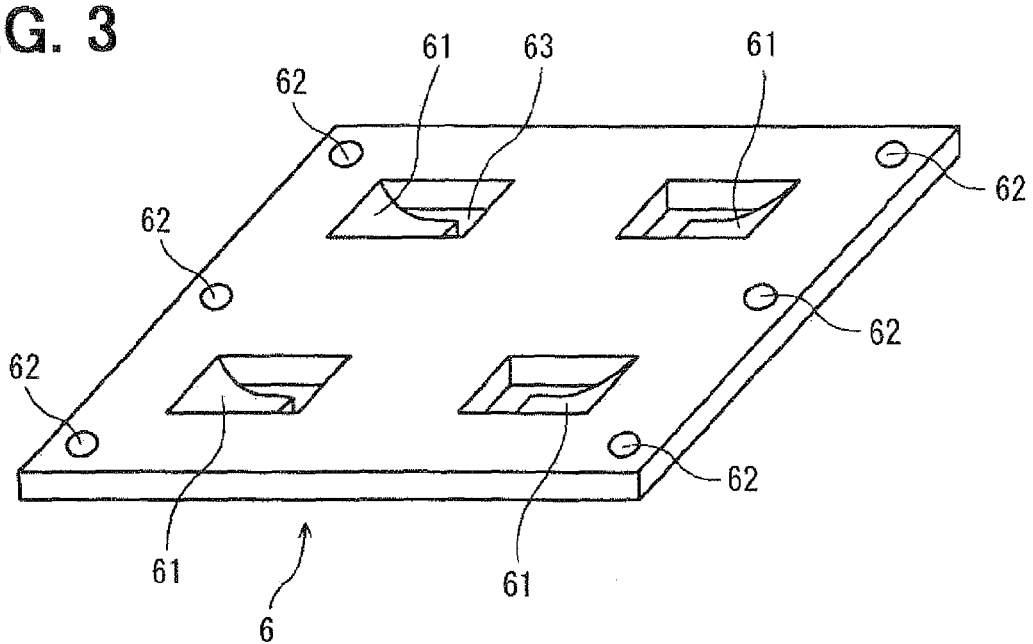
FIG. 3 is a diagram illustrating a perspective view of a plate spring in the structure of FIG. 1.

The elastic biasing member 6 has elasticity and a flat, rectangle shape, as shown in FIG. 3. For example, a plate spring can be used as the elastic biasing member 6. The elastic biasing member 6 can be made of phosphor bronze, stainless steel, non-stainless steel, or the like. Alternatively, the elastic biasing member 6 can be made of a ferromagnetic material, which has a high permeability and a low electrical resistance. For example, the elastic biasing member 6 can be made of a ferrous material mainly composed of iron. It is preferable that the elastic biasing member 6 be made of a material having a high hysteresis loss and a low resistivity. When the elastic biasing member 6 is made of such a ferromagnetic material, an electromagnetic shielding effect occurring in the elastic biasing member 6 due to eddy current can be increased as compared to when the elastic biasing member 6 is made of a nonmagnetic material such as phosphor bronze. In such an approach, the elastic biasing member 6 can serve as an electromagnetic shield for reducing electromagnetic noise transmitted between the electronic device 1 and outside.

The elastic biasing member 6 has through holes 62 and is fixed to top surfaces of the wall members 7 by screws 9 inserted through the through holes 62. Likewise, the elastic biasing member 6 is fixed to a top surface of the column member 8 by the screws 9 inserted through the through holes 62. Thus, the elastic biasing member 6 is supported by the base plate 2 through the wall members 7 and the column member 8.

The elastic biasing member 6 further has a slit 10. The busbar 3 passes through the slit 10 so that the first and second ends of the busbar 3 can be located opposite each other across the biasing member 6. Thus, the second end of the busbar 3 can be soldered to the printed circuit board (not shown) located above the biasing member 6.

The elastic biasing member 6 further has four pressing members 61 shaped like a hook. As shown in FIG. 2, each pressing member 61 is located directly above a corresponding electronic device 1 and configured to press a top surface of the body of the electronic device 1 toward the base plate 2. For example, the elastic biasing member 6 having the pressing members 61 and the through holes 62 can be formed from a carbon steel plate by press punching, stamping, or the like. After the pressing members 61 are formed by press punching, openings 63 appear on the elastic biasing member 6. The elasticity of the elastic biasing member 6 can be increased by applying a heat treatment such as quenching to the elastic biasing member 6. The pressing member 61 extends obliquely downward to be in contact with the top surface of the body of the electronic device 1 and then extends horizontally along the top surface of the body of the electronic device 1.

The electronic device mounting structure according to the first embodiment can be manufactured as follows. Firstly, the base plate 2, the wall members 7, and the column member 8 are formed by aluminum die casting such that the wall members 7 and the column member 8 can be integrally formed with the base plate 2. Then, the busbars 3 are fixed to the base plate 2 through the insulation film 5. Then, the lead terminals 4 of each electronic device 1 are soldered to the first end of the corresponding busbar 3. Then, the elastic biasing member 6 is fixed to the top surfaces of the wall members 7 and the column member 8 of the base plate 2 by the screws 9. Further, the printed circuit board (not shown) is fixed to a wall member (not shown), which is taller than the wall members 7 and the column member 8, of the base plate 2. Finally, the second end of the busbar 3 is inserted into the hole of the printed circuit board and soldered to the trace pattern around the hole. In this way, the electronic device mounting structure can be manufactured.

The electronic device mounting structure according to the first embodiment can provide the following advantages.

Heat produced by the electronic device 1 is transferred to the base plate 2 through the busbar 3 and the insulation film 5. Likewise, heat produced by the busbar 3 and transferred to the busbar 3 from the electronic device 1 is transferred to the base plate 2 through the insulation film 5. Since the base plate 2 and the busbar 3 are electrically insulated from each other through the insulation film 5, the heat can be efficiently transferred from the busbar 3 to the base plate 2.

Further, the heat in the electronic device 1 is transferred to the elastic biasing member 6 through the pressing member 61. Then, the heat transferred to the elastic biasing member 6 is transferred to the base plate 2 through the wall members 7 and the column member 8.

Since the electronic device 1 is pressed by the elastic biasing member 6 against the base plate 2 through the busbar 3, thermal resistances among the electronic device 1, the base plate 2, and the busbar 3 are reduced. Therefore, the heat in the electronic device 1 is efficiently transferred to the busbar 3, and the heat in the busbar 3 is efficiently transferred to the base plate 2. Thus, the heat in the electronic device 1 and the busbar 3 can be efficiently dissipated through the base plate 2. As a result, temperature increases of the electronic device 1 and the busbar 3 can be reduced. Therefore, the electronic device 1 can be prevented from being thermally broken down.

Further, since the temperature increases are reduced, thermal stress due to a difference in coefficients of linear expansion between the base plate 2 and the busbar 3 is reduced accordingly. Therefore, the lead terminal 4 of the electronic device 1 can surely remain soldered to the busbar 3.

Further, the heat in the electronic device 1 is transferred to the base plate 2 through the elastic biasing member 6, the wall members 7, and the column member 8. The heat can easily travels through the elastic biasing member 6, because the elastic biasing member 6 is has a plate-like shape. Therefore, the heat in the electronic device 1 can be easily transferred to the wall members 7 and the column member 8 through the elastic biasing member 6. Since the wall members 7 and the column member 8 are integrally formed with the base plate 2 by aluminum die casing, not only the base plate 2 but also each of the wall members 7 and the column member 8 can serve as a heatsink. Thus, the heat in the electronic device 1 can be efficiently dissipated through the wall members 7 and the column member 8.

Further, since the wall members 7 and the column member 8 are located near the electronic device 1, a length of a heat transfer pathway from the electronic device 1 to the wall members 7 and the column member 8 through the elastic biasing member 6 is short. Accordingly, thermal resistance of the heat transfer pathway is reduced so that the heat in the electronic device 1 can be efficiently transferred to the wall members 7 and the column member 8 through the elastic biasing member 6.

The elastic biasing member 6 is shaped like a plate and is formed from a steel plate by press punching, stamping, or the like. Therefore, as compared to the conventional gate-shaped biasing member disclosed in U.S. Pat. No. 7,250,674, the elastic biasing member 6 can be easily manufactured at low cost. Further, as compared to the conventional gate-shaped biasing member, the elastic biasing member 6 can have a uniform elasticity due to its substantially uniform shape Therefore, the biasing member 6 can equally press the electronic device 1.

The elastic biasing member 6 can be made of a ferromagnetic material. In such a case, a large iron loss in the elastic biasing member 6 can occur with a change in an electromagnetic field. Thus, the elastic biasing member 6 can suitably serve as an electromagnetic shield for reducing electromagnetic noise transmitted between the electronic device 1 and outside. Therefore, an additional electromagnetic shield can be eliminated. It is preferable that the elastic biasing member 6 be made of a ferromagnetic material having a relative magnetic permeability of 1000 (i.e., one thousand) or more. For example, the elastic biasing member 6 can be made of carbon steel.

One pressing member 61 of the elastic biasing member 6 is provided to each electronic device 1. In such an approach, each electronic device 1 can be equally pressed by the elastic biasing member 6. Further, even if the electronic devices 1 have different sizes and shapes, pressing force suitable for each electronic device 1 can be generated by adjusting the length, the width, and/or, the obliquity angle of the corresponding pressing member 61.

Figure 5:
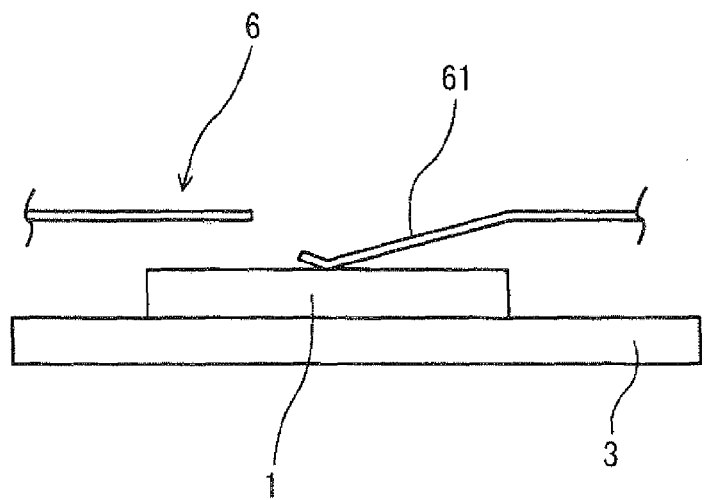
FIG. 5 is a diagram illustrating a side view of an electronic device mounting structure according to a modification of the first embodiment.
Figure 6:
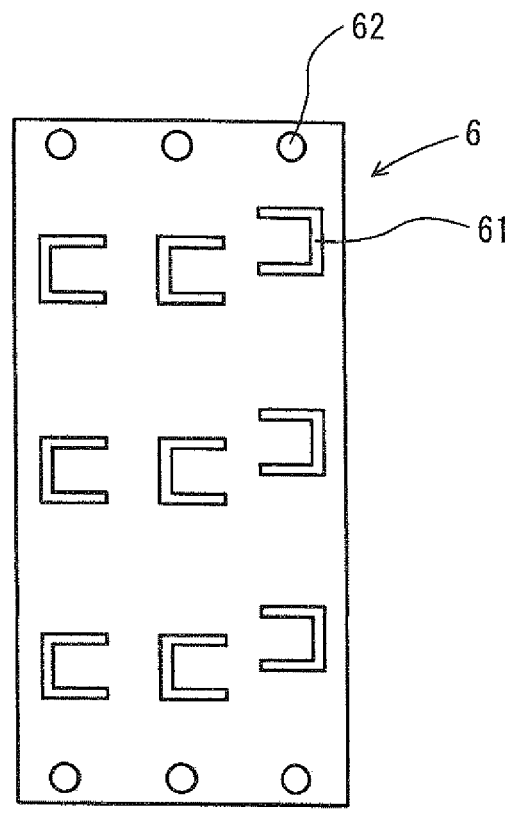
FIG. 6 is a diagram illustrating a top view of a plate spring in the structure of FIG. 5.

For example, the first embodiment can be modified as follows. The number of the pressing members 61 can vary. For example, as shown in FIGS. 5, 6, the elastic biasing member 6 can have nine pressing members 61 for pressing nine electronic devices 1, respectively. The elastic biasing member 6 shown in FIGS. 5, 6 is formed so that each pressing member 61 can be bent downward in a direction perpendicular to a longitudinal direction of the elastic biasing member 6. In FIGS. 5, 6, each electronic device 1 is pressed by one pressing member 61. Alternatively, each electronic device 1 can be pressed by two or more pressing members 61.

Second Embodiment

Figure 7:
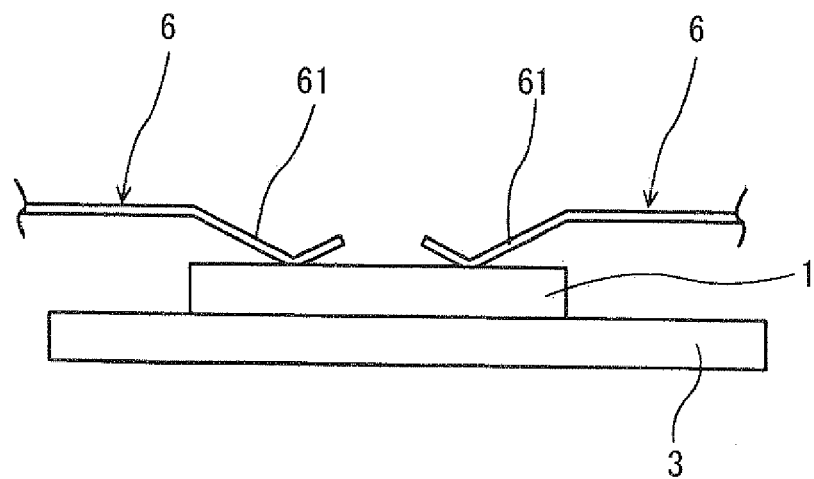
FIG. 7 is a diagram illustrating a side view of an electronic device mounting structure according to a second embodiment of the present invention.
Figure 8:
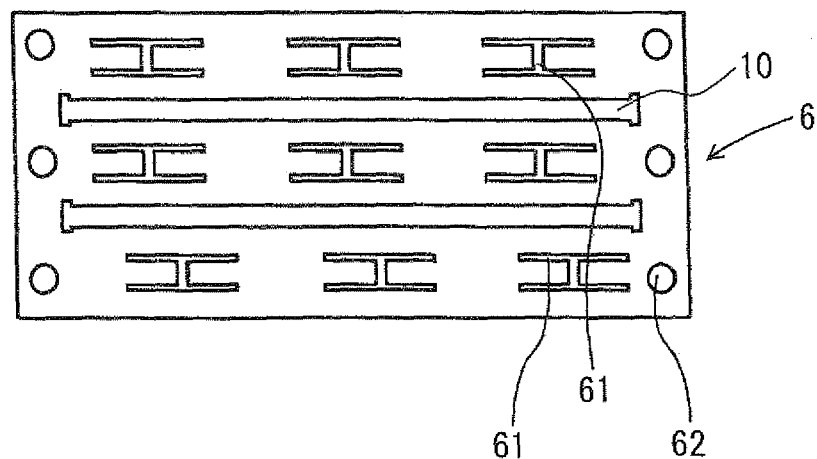
FIG. 8 is a diagram illustrating a top view of a plate spring in the structure of FIG. 7.

An electronic device mounting structure according to a second embodiment of the present invention is described below with reference to FIGS. 7 and 8. A difference between the first and second embodiments is as follows. In the second embodiment, two pressing members 61 facing with each other are paired. The pair of pressing members 61 is configured to press the top surface of the body of the corresponding electronic device 1 against the base plate 2 through the busbar 3. In such an approach, the electronic device 1 can be tightly pressed against the base plate 2. Further, the pressing force can be substantially uniform over the electronic device 1.

Third Embodiment

An electronic device mounting structure according to a third embodiment of the present invention is described below with reference to FIGS. 9 and 10. A difference between the first and third embodiments is as follows.

Figure 10:
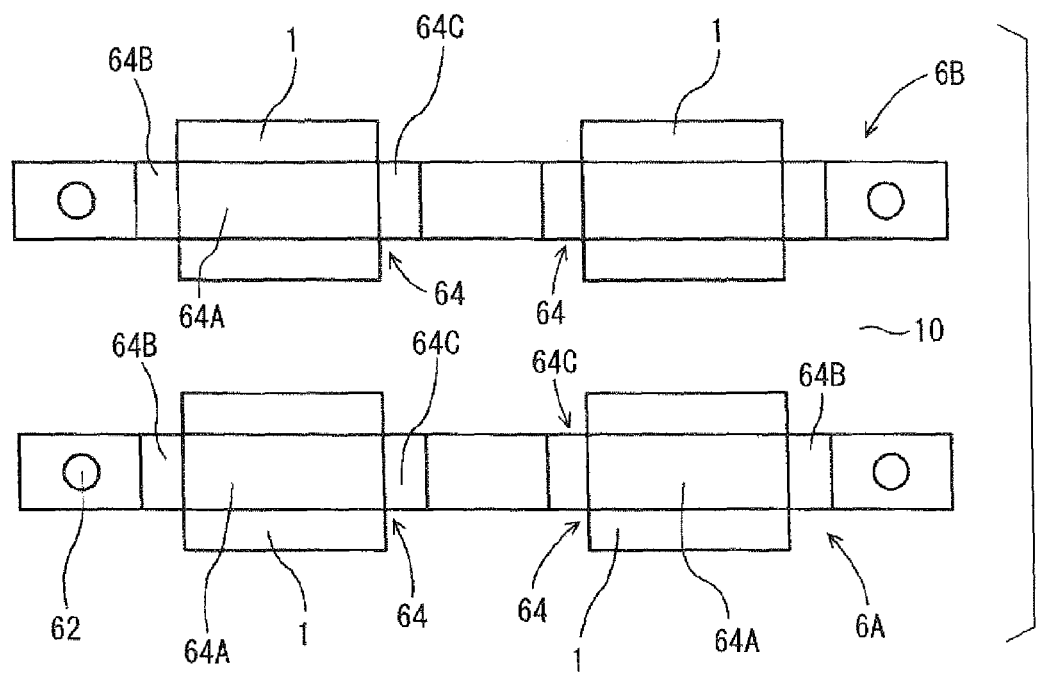
FIG. 10 is a diagram illustrating a top view of a plate spring in the structure of FIG. 9.

In the third embodiment, as shown in FIG. 10, two separate elastic biasing members 6A, 6B are used instead of the single elastic biasing member 6. Each of the elastic biasing members 6A, 6B is shaped like a long narrow plate and has two pressing members 64. The elastic biasing members 6A, 6B are arranged parallel to each other so that a predetermined space can be maintained between the elastic biasing members 6A, 6B. The space can be used as the slit 10, through which the busbar 3 passes.

The elastic biasing members 6A, 6B are the same in structure. FIG. 9 illustrates the elastic biasing member 6A. As shown in FIG. 9, each pressing member 64 is shaped like a rectangular recess. Specifically, the pressing member 64 has a flat portion 64A and leg portions 64B, 64C. The flat portion 64A extends substantially parallel to a base portion of the elastic biasing member 6A. The leg portions 64B, 64C extend downward from the base portion toward the top surface of the electronic device 1. Each end of the flat portion 64A is supported by (i.e., joined to) the leg portions 64B, 64C so that the flat portion 64A can be in contact with the top surface of the electronic device 1. In such an approach, the electronic device 1 can be tightly pressed against the base plate 2 through the busbar 3. The length of each of the leg portions 64B, 64C is adjusted according to the height of the electronic device 1 so that the electronic device 1 can be pressed by suitable force. It is preferable that the flat portion 64A be in full contact with the top surface of the electronic device 1. In such an approach, the pressing force can be substantially uniform over the electronic device 1. Alternatively, the flat portion 64A can be partial in contact with the top surface of the electronic device 1. It is preferable that each of the leg portions 64B, 64C extend substantially perpendicular with respect to the base portion of the elastic biasing member 6A. Alternatively, each of the leg portions 64B, 64C can extend obliquely with respect to the base portion of the elastic biasing member 6A.

The elastic biasing members 6A, 6B can be manufactured easily by press punching, for example. The elastic biasing member 6A, 6B can be integrally formed together. That is, the elastic biasing member 6A, 6B can be formed as a single piece.

Fourth Embodiment

An electronic device mounting structure according to a fourth embodiment of the present invention is described below with reference to FIG. 11. A difference between the third and fourth embodiments is as follows.

Figure 9:
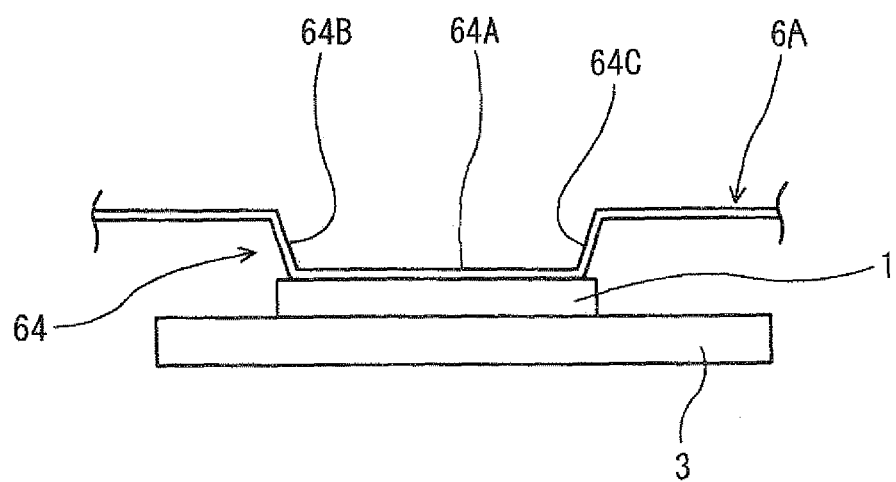
FIG. 9 is a diagram illustrating a side view of an electronic device mounting structure according to a third embodiment of the present invention.
Figure 11:
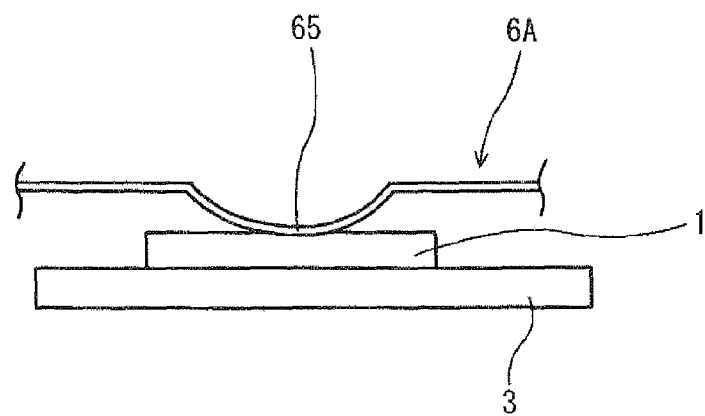
FIG. 11 is a diagram illustrating a side view of an electronic device mounting structure according to a fourth embodiment of the present invention.

As can be seen by comparing FIG. 9 and FIG. 11, whereas the pressing member 64 of the third embodiment is shaped like a rectangular recess, a pressing member 65 of the fourth embodiment is shaped like a curved recess. Each end of the pressing member 65 is supported by (i.e., joined to) the base portion of the elastic biasing member 6A so that the center of the pressing member 65 can be in contact with the top surface of the electronic device 1. In such an approach, the electronic device 1 can be tightly pressed against the base plate 2 through the busbar 3. The elastic biasing member 6A can be manufactured easily by press punching, for example Like the third embodiment, another elastic member can be placed parallel to the elastic biasing member 6A.

MODIFICATIONS

The embodiments described above may be modified in various ways. For example, the wall member 7 (column member 8) can be formed separated from the base plate 2. That is, the base plate 2 and the wall member 7 can be formed as separate pieces, and then the wall member 7 can be fixed to the base plate 2 by soldering, welding, or the like. The elastic biasing member 6 can be used as a conductor (i.e., busbar) and connected to a ground potential. In such a case, an electrical insulation film can be interposed between the elastic biasing member 6 and the wall member 7 (column member 8). The slit 10 can be replaced with a though hole.

The first to fourth embodiments can be combined with each other. For example, the elastic biasing member 6 can have all of the pressing member 61 shaped like a hook, the pressing member 64 shaped like a rectangular recess, and the pressing member 65 shaped like a curved recess.

Such changes and modifications are to be understood as being within the scope of the present invention as defined by the appended claims.

What is claimed is:

1. An electronic device mounting structure comprising:
   a base having a thermal conductivity;
   a busbar located on a surface of the base and electrically insulated from the base;
   an electronic device located on the busbar and electrically coupled to a first end of the busbar;
   a wall member having a thermal conductivity and standing on a surface of the base, the wall member including first and second portions located opposite each other across the electronic device; and
   a plate spring supported by the first and second portions of the wall member and extending substantially parallel to the surface of the base, the plate spring pressing the electronic device against the base though the busbar and having a thermal conductivity to transfer heat from the electronic device to the wall member therethrough.

2. The electronic device mounting structure according to claim 1,
   wherein the busbar comprises a plurality of busbars,
   wherein the electronic device comprises a plurality of electronic devices, each electronic device being electrically coupled to a corresponding busbar,
   wherein the plurality of electronic devices is located at a different position in a direction parallel to the surface of the base, and
   wherein the plate spring is configured to collectively press the plurality of electronic devices.

3. The electronic device mounting structure according to claim 2,
   wherein the plate spring includes a plurality of pressing members, each pressing member extending from the plate spring to a top surface of the corresponding electronic device.

4. The electronic device mounting structure according to claim 3,
   wherein at least one of the plurality of pressing members includes a hook member, and
   wherein the hook member has a first end joined to the plate spring and a second end extending obliquely downward to the top surface of the corresponding electronic device.

5. The electronic device mounting structure according to claim 4,
   wherein the hook member includes a pair of hook portions facing each other, and
   wherein the pair of hook portions is configured to press the corresponding electronic device.

6. The electronic device mounting structure according to claim 3,
   wherein the plate spring is formed from a single metal plate by press punching so that the plurality of pressing members is integrally formed with the plate spring.

7. The electronic device mounting structure according to claim 3,
   wherein at least one of the plurality of pressing members includes a flat portion and at least two leg portions,
   wherein each leg portion has a first end joined to the plate spring and a second end extending toward the top surface of the corresponding electronic device, and
   wherein the flat portion is joined between the second ends of the leg portions and extends along the top surface of the corresponding electronic device.

8. The electronic device mounting structure according to claim 3,
   wherein at least one of the plurality of pressing members includes a curved portion and at least two leg portions,
   wherein each leg portion is joined to the plate spring, and
   wherein the curved portion is joined between the leg portions and curved toward the top surface of the corresponding electronic device.

9. The electronic device mounting structure according to claim 1,
   wherein the plate spring has an opening, and
   wherein the busbar passes through the opening so that a second end of the busbar is located opposite the first end of the busbar across the plate spring.

10. The electronic device mounting structure according to claim 1,
    wherein the plate spring is made of a ferromagnetic material and configured as an electromagnetic shield for the electronic device.

11. The electronic device mounting structure according to claim 1,
    wherein the base and the wall member are integrally formed with each other and configured as a heatsink.

12. The electronic device mounting structure according to claim 1,
    wherein the electronic device includes a body and a lead terminal protruding from the body, and
    wherein the lead terminal is electrically coupled to the first end of the busbar.

* * * * *